United States Patent
Van Der Veen (10) Patent No.: US 7,315,351 B2
(45) Date of Patent: Jan. 1, 2008

(54) LITHOGRAPHIC APPARATUS, DEVICE MANUFACTURING METHOD AND DEVICE MANUFACTURED THEREWITH

(75) Inventor: Paul Van Der Veen, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 237 days.

(21) Appl. No.: 10/975,037

(22) Filed: Oct. 28, 2004

(65) Prior Publication Data
US 2006/0097199 A1     May 11, 2006

(51) Int. Cl.
*G03B 27/54* (2006.01)
(52) U.S. Cl. ............................. 355/67; 355/71; 378/34
(58) Field of Classification Search ................. 355/53, 355/67, 71
See application file for complete search history.

(56) References Cited

U.S. PATENT DOCUMENTS

| | | | |
|---|---|---|---|
| 4,928,008 A * | 5/1990 | Huggins et al. ......... 250/231.1 |
| 6,404,499 B1 * | 6/2002 | Stoeldraijer et al. ........ 356/400 |
| 6,455,862 B1 * | 9/2002 | van der Veen et al. .. 250/492.2 |
| 6,583,855 B2 * | 6/2003 | Krikke et al. .................. 355/67 |
| 2004/0090607 A1 * | 5/2004 | Yoshida ........................ 355/55 |

* cited by examiner

*Primary Examiner*—D. Rutledge
(74) *Attorney, Agent, or Firm*—Pillsbury Winthrop Shaw Pittman LLP (57) ABSTRACT

The invention relates to a lithographic apparatus and a device manufacturing method. The lithographic apparatus is of the scanning type, in which a radiation beam effectively scans across a surface of a substrate. The apparatus comprises a beam attenuator, e.g. in the form of a filter, having an attenuation value profile that varies as a function of position along the scanning direction. Appropriate selection of the attenuation value profile allows the illumination of the substrate to be more homogeneous, since e.g. received dose effects due to pulse to pulse variations in a pulsed illumination source are much better averaged out.

26 Claims, 6 Drawing Sheets

Fig 10b

LITHOGRAPHIC APPARATUS, DEVICE MANUFACTURING METHOD AND DEVICE MANUFACTURED THEREWITH

FIELD

The present invention relates to a lithographic apparatus, a method for manufacturing a device, and a device manufactured therewith.

BACKGROUND

A lithographic apparatus is a machine that applies a pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) of a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Imprinting may be carried out in a step-like way, wherein a stationary substrate is imprinted with a pattern from a stationary patterning device. An alternative way comprises scanning the substrate with a patterned beam. One of the known ways to do this is by way of pulsed illumination of the patterning device, and thus of the substrate. The image on the substrate may thus be built up of many pulsed illuminations of the patterning device, in such a way that the pulsed images overlap locally, and a sharp image is formed. This scanning type of illumination will be discussed more extensively below.

A problem with scanning type of illumination is that there typically are variations in the intensity of the radiation beam. These differences entail that different parts of the target portion of the substrate may receive a different total illumination dose, which dose differences may become visible e.g. as feature variations that extend in a direction perpendicular to the scanning direction. Especially for pulsed illumination, these differences may become significant, as for example an incorrect scan speed with respect to the scanning beam may result in different portions of the substrate actually being illuminated by a different number of pulses. Furthermore, pulse-to-pulse variations may also give rise to inhomogeneous illumination. While the prior art has attempted to address this issue, such attempts have raised other undesirable consequences.

SUMMARY

It is desirable to provide a lithographic apparatus and device manufacturing method and a device manufactured therewith, that show a low variation in radiation beam intensity, and which can at least partially obviate the above mentioned disadvantage of increased beam size. Herein, the radiation beam intensity relates to basic radiation beam intensity, before the influence of a patterning device.

According to an aspect of the invention, there is provided a lithographic apparatus comprising an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein at least said substrate table is moveable in a scanning direction with respect to said support, the apparatus further comprising a beam attenuator that is constructed to decrease an intensity of a part of the radiation beam, wherein said beam attenuator has a attenuation value profile that varies as a function of position along said scanning direction.

According to an aspect of the invention, there is provided a device manufacturing method comprising projecting a patterned beam of radiation onto a substrate by way of a lithographic apparatus according to the invention, wherein said beam attenuator is positioned in said radiation beam.

According to an aspect of the invention, there is provided a device manufactured according to the method of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In all of the figures, similar parts are denoted with like reference numerals.

Figure 1A:
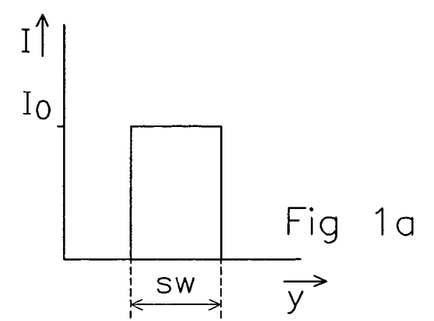
FIGS. 1a, b schematically show two prior art beam intensity profiles.

Referring to FIGS. 1a,b (prior art) and 1c, and to FIGS. 2a, b and 2c, the influence of beam intensity profile on possible variations in the received dose, when such beam intensity profile is used in a lithographic apparatus, will be discussed first.

FIG. 1a shows a rectangular beam intensity profile, in other words, the beam intensity at the level of the patterning device is substantially the same for every part of the radiation beam. In the context of this application, the term radiation beam always includes the patterned radiation beam, unless explicitly excluded. In other words the radiation beam relates to the basic, underlying radiation and its intensity distribution. Of course, patterning devices will have an influence on this distribution, and will impart the radiation beam with a desired pattern. The radiation beam may then be referred to as a patterned radiation beam. The radiation beam has a width in scanning direction of sw.

Figure 2A:
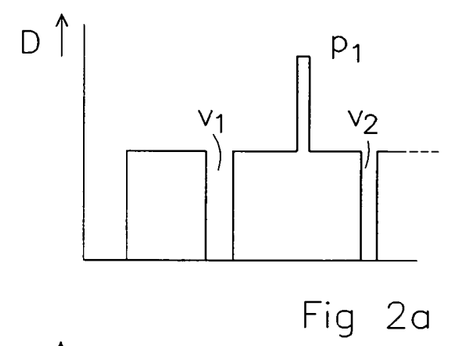
FIG. 2a, schematically show received dose as a function of position when illumination (scanning) is irregular for the profiles of FIGS. 1a and 1b, respectively, while FIG. 2c similarly shows dose as a function of position for the profile of FIG. 1c, when scanning is irregular.

In FIG. 2a, the received dose D is plotted against position in scanning direction, for a situation in which only one pulse suffices for a correct illumination. Herein, the effect of a patterning device blocking some of the light has not been taken into account. It is only the basic illumination, without patterning which is used in this example. On the basis of this basic illumination, it is relatively easy to determine the homogeneity of the illumination.

The dose D is built up as follows. In scanning mode of the lithographic apparatus, and at a certain position of the patterning device and the substrate with respect to each other, a pulsed radiation source, such as an excimer laser, fires a pulse. This pulse passes through an illuminator, the patterning device and a projection system, and is received by a target portion of the substrate. For example, the leftmost "block" in the dose-curve of FIG. 2a represents the dose as received by the corresponding part of the substrate. After this pulse, the patterning device and/or substrate are moved with respect to each other, and with respect to the path of the radiation beam, such that a new, adjacent part of the substrate may be illuminated. In the ideal case, the next pulse fired by the laser would cause an adjacent part of the substrate, which accurately lies next to the previously illuminated part, to be illuminated. This would be represented in the diagram of FIG. 2a by an adjacent "block" to the right of the first mentioned "block". However, due to an irregular, incorrect timing of firing time of the laser with respect to the movement of the patterning device and/or substrate, the pulse is given at an incorrect position of substrate and patterning device. The result could be that a part of the substrate receives not exactly one but zero pulses. This is visible as a "valley" or hiatus $v_1$ in the diagram, and in a second case also as valley $v_2$. Similarly, a too quick timing of firing or the like may cause a strip-like part of the substrate to be illuminated by two pulses instead of one pulse. In other words, the illuminated parts of two pulses partly overlap, and locally the dose is twice as high as is desired. This is visible in the diagram as a peak $p_1$.

Note that in the above example, only one pulse is needed for a correct total illumination of the target portion. In this example the effect of a part of the substrate receiving one pulse more than intended or one pulse less (so no pulse at all in this example) is extremely clear. This step-like variation of total dose is sometimes called pulse quantization. It will be apparent that in a more sensible and common approach for the illumination of each part of the target portion multiple pulses, e.g. between 30 and 100 pulses, are used to build up the complete illumination, so that the effect of one pulse more or one pulse less will be less visible, corresponding to between 1% and ±3.3% variation in total received dose. In this way irregularities are smeared out. Nevertheless, for example in lithographic methods, such variations may prove to be still significant. One more important reason to use multiple pulses instead of just one pulse is that radiation sources are likely to show a considerable pulse to pulse energy variation, although the average value may be reasonably well controlled. Hence, by using multiple pulses, individual pulse energy variations average out, and a good dose control may be obtained.

Figure 1B:
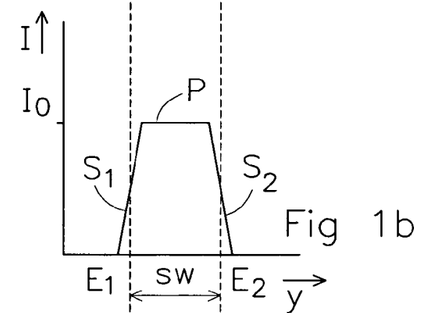
Figure 2B:
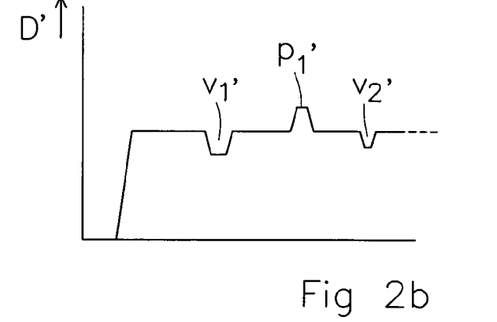

In FIG. 1b, there is shown another prior art beam intensity profile, and its effect on received dose is shown in FIG. 2b. This profile may be obtained by defocusing.

FIG. 1b shows a trapezoid-shaped beam intensity profile, i.e. a profile starting at a first edge $E_1$, with a zero beam intensity value, increasing with a first slope $S_1$ towards a plateau P in the centre of the profile, said plateau P having a constant maximum beam intensity with an intensity value of $I_0'$. To the right of the profile, the intensity value decreases with a second slope $S_2$ towards a second edge $E_2$ to a zero beam intensity value. The effective width (i.e. full width at half maximum) of the total beam profile is substantially the same as in FIG. 1a. The total width is however larger than sw, due to the slopes. This increases the total scanning length.

The beam intensity profile of FIG. 1c according to the invention has been created using a beam attenuator active in the path of the radiation beam and having an attenuation value profile that varies as a function of position along said scanning direction, as will be further explained in detail below. This offers the possibility of influencing the relative contribution of a pulse or other part of the illumination of a target portion, such as to be able to control the total received dose in a part of that target portion while still being able to correct differently in another part of the target portion. In such a way, homogeneity of illumination may be increased. In particular, an attenuation value profile that is a non-rectangular function of position already offers such functionality.

Figure 1C:
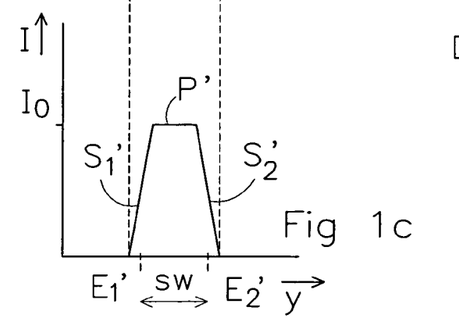
FIG. 1c shows a beam intensity profile according to the invention.

In FIG. 1c, the profile has slopes $S_1'$, and $S_2'$, which are wider than those of the profile of FIG. 1b. The total slit width is sw, while the effective slit width is less than sw. Note that wider slopes would be a problem in FIG. 1b, because there the slit width would increase very much while this is not the case in FIG. 1c.

Figure 2C:
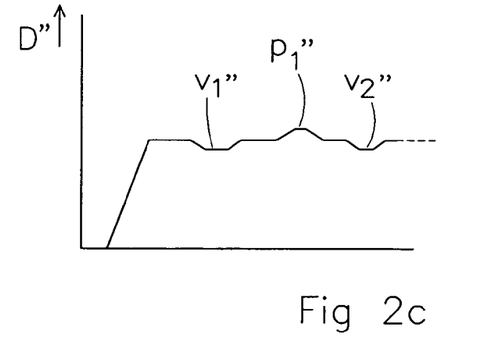

The effect of the wider slopes is visible in FIG. 2c, where the like valleys, $v_1''$ and $v''$ and the peak $p_1''$ are even less deep or high, and are also wider. Hence the effect of the wider slopes is a double effect. Not only are the valleys and peaks, i.e. the dose variations, less high, but they are also wider, hence more smeared out. Especially in the case of multiple pulses in the slit, this helps to further homogenize the received dose.

It is to be noted that here, as in all of the discussion, the attenuation value profile relates to the attenuation value profile of an attenuator portion that, when the apparatus is in use, is illuminated by the radiation beam. Parts of the beam attenuator outside that attenuator portion are not relevant for the illumination, and do not play a role in this discussion.

An attenuation profile that varies as a function of position along said scanning direction, in particular a non-rectangular function, ensures that in that the attenuation profile there are slopes, which may be describes as a part of the profile between a lower attenuation value (or even a minimum attenuation value) and a higher attenuation value (or even maximum attenuation value). These slopes offer the advantage of improving dose homogeneity, without the disadvantage of increased radiation beam diameter. The exact shape of the slopes is not limited to straight inclined lines. In fact, smoother curves offer advantages, such as even further improved homogeneity, in some cases. Other advantageous profile shapes besides the trapezoid shapes are substantially Gaussian shapes, bell-shapes, error-function shapes, et cetera, without however being limited to such shapes.

In particular, the attenuation value profile is a function having a first attenuation value at a first edge of said attenuator portion and a second attenuation value at a second edge of said attenuator portion, wherein said first and second edges are located opposite from each other in said scanning direction.

In one embodiment said first attenuation value and said second attenuation value are each smaller than an average attenuation value as averaged over said attenuator portion and along said scanning direction. This allows that the illumination (pulsed or continuously) delivered in the slopes, i.e. near or at the edges, has relatively less influence on the total dose than the illumination delivered in other parts of the profile with a higher attenuation value, and offering a more homogeneous dose. The averaged value is an attenuation value averaged in scanning direction over the beam. Although the attenuation profile may vary such that at certain positions outside the slopes, the attenuation value is even lower than said first or second attenuation value, the function, in certain embodiments, substantially has only one or two local minimum values.

Advantageously, said first and/or said second attenuation value are substantially zero. This ensures that at least one of the slopes goes to a zero value, and this in turn ensures that the relative contribution of pulsed or continuous illumination in that slope also goes to zero. Overlapping slopes than provide a good homogeneity improving effect.

The relative width of each of the slopes adjacent the first and second edge respectively, i.e. the ratio of slope width to total beam width in scanning direction, is at least 0.05, and may have higher values, such as 0.1 or at a high end, approximately 0.5. Such slopes have a substantial width, and hence offer more possibilities for at least part of the illumination, either a number of pulses or a part of continuous illumination, to be provided with an attenuated intensity. This increases the homogeneity. Note that the slopes need not be straight lines or smooth curves. Even slopes that are built up of a number of step-like changes in attenuation value provides a homogeneity improving effect.

In particular when manufacturing ICs, where dose variation in intra-die structures may become important for one or more layers, using a lithographic apparatus, the production process and ICs obtained thereby are very sensitive to variation of beam intensity as described here. It has been found that this type of variation is likely to become visible (e.g. to the human eye) as a stripe-like line of feature variations on the surface or in the structure of the IC. This is a result of a locally too low (or too high) illumination intensity which causes a different received dose. The human eye is very sensitive to such stripes, much more so than for a collection of distributed individual dots. Hence, in an embodiment of the lithographic apparatus to the invention, as well as of the method according to the invention, the device to be manufactured or substrate is an IC. E.g. memory-chips may be used or produced with improved illumination homogeneity. In particular, with the present lithographic apparatus, and its associated use, to be described hereinbelow, it is easier possible to obtain a device with an illumination homogeneity of better than e.g. 0.1% over its surface area, say for 30 or more pulses in the scanning beam width, even with excimer lasers or other pulsed radiation sources. In other words, along a line in scanning direction, the difference between maximum and minimum total received dose of less than 0.1% can be achieved.

This is advantageous, since the total received dose will vary only very slightly around the required dose for a correct development. More importantly, the homogeneity of the illumination, or intensity distribution, is improved for the same number of used pulses. Alternatively a desired homogeneity may be obtained using fewer pulses. This saves on the number of pulses, which also increases possible throughput, but also diminishes possible effects of a too high dose in areas that are overexposed, due to the variations in illumination.

The beam intensity value near and at least one edge of the profile, and in certain embodiments, near and at both edges of the profile, is substantially zero. Especially in combination with the effect of the slope this ensures that the contribution to the total received dose of the first and last parts of the radiation beam, e.g. the first and last pulses, gradually reduces to zero.

The effect of this smoother profile is visible in FIG. 2c, showing the total received dose as a function of position. Here, the parts corresponding to the irregularities in the dose diagram of FIG. 1a are now much less visible: there are only minor variations, such as valleys $v_1"$ and $v_2"$, as well as a peak $p_1"$. This effect is due to overlapping slopes for different pulses (or corresponding parts of the illumination). As this effect is already clearly visible with only one required pulse, the effects will be even better when more than one pulse is required for a correct illumination.

The intensity profile of FIG. 1c is obtained, starting from the intensity profile of FIG. 1a, by introducing a beam attenuator having a attenuation value profile similar to the desired intensity profile in the radiation beam. Note that for the purpose of this invention, the attenuation value is to be understood as the ratio of intensity of the beam after passing or striking the beam attenuator, i.e. downstream, divided by the original intensity before the beam attenuator, i.e. upstream. This encompasses e.g. the case wherein the beam attenuator comprises a filter, in which the attenuation value may be equaled to the transmission value, and also the case of a mirror, in which case the attenuation value may be equaled to a reflectivity value. Note that an attenuation value of 1 (equaling 100%) comes down to no attenuation at all, while an attenuation value of 0 comes down to total extinction, always relating to one relevant measuring position.

The attenuation value profile advantageously has an axis of substantial symmetry in a direction perpendicular to the scanning direction of the lithographic apparatus. This prevents that the substrate is illuminated by different angular distributions or the like. Nevertheless, in many cases these effects are negligible, and a non-symmetric profile works sufficiently well.

Figure 3A:
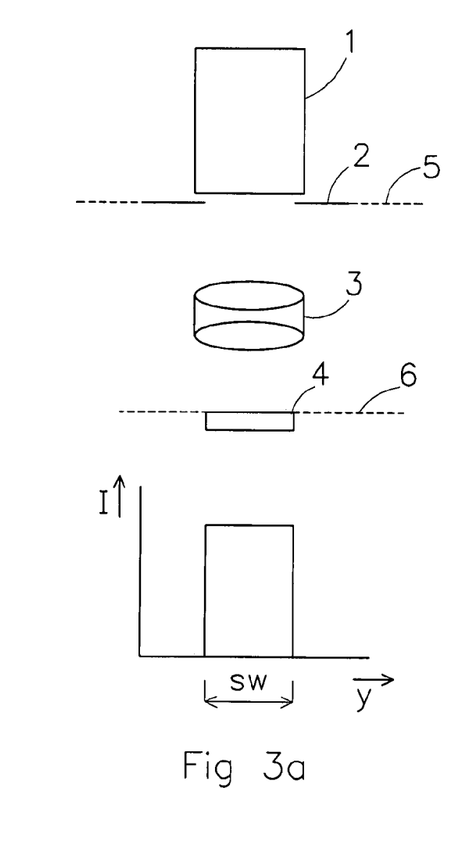
FIGS. 3a and 3b each very schematically show a part of a conventional lithographic apparatus with their associated beam intensity profiles.
Figure 3B:
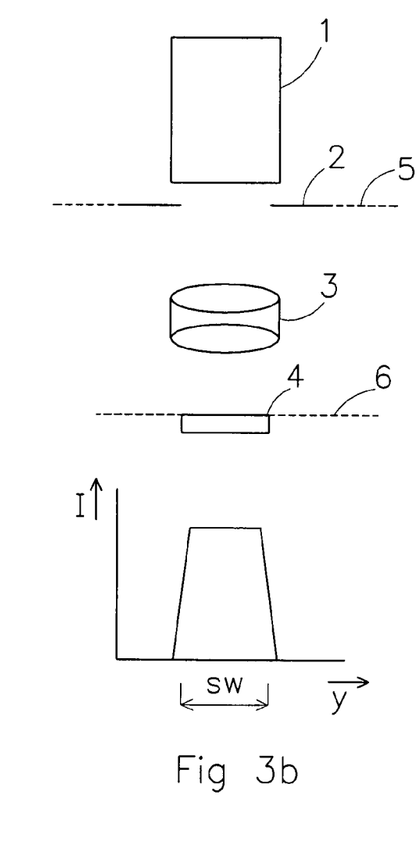
Figure 4:
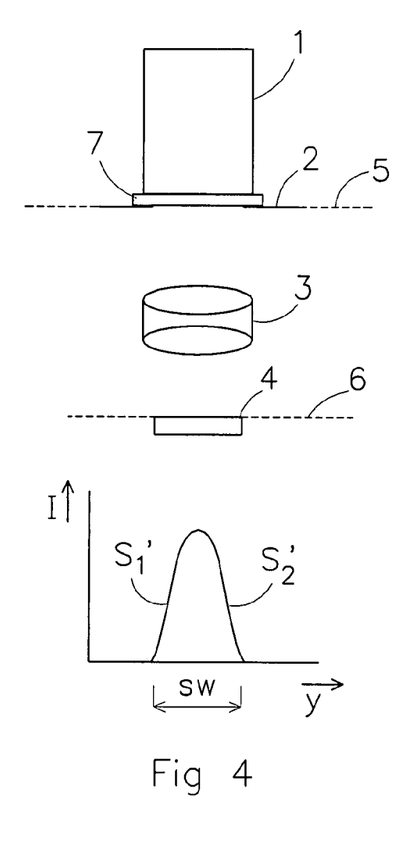
FIG. 4 shows a part of a lithographic apparatus according to the invention with its associated beam intensity profile.

FIGS. 3a, and 3b each very schematically show conventional a part of a lithographic apparatus with their associated beam intensity profiles, while FIG. 4 shows a part of a lithographic apparatus according to the invention with its associated beam intensity profile.

In particular, the top part of FIG. 3a shows a part of a prior art lithographic apparatus with an optical system comprising a quartz rod 1, masking blades 2, a lens 3 and a patterning device 4.

The quartz rod 1 is an example of an element to improve the uniformity of the radiation distribution through internal reflection of the original source of radiation at the inner walls of the rod. another example is a fly's eye lens. Note furthermore that the transparent rod need not to be made of quartz. E.g. for certain wavelengths, other transparent materials such as calcium fluoride may be advantageous. A radiation beam (not shown here) in use exits from the rod 1 in an exit plane 5. This exiting radiation beam is imaged by lens 3 onto a patterning device 4, for example a mask or the like. The surface of the patterning device 4 lies in plane 6. Good imaging definition may be obtained when the plane 6 is an image plane of the exit plane 5.

The result of the illumination with the beam, the masking blades 2 and the imaging is a rectangular intensity profile of the beam on the patterning device 4, in particular at the surface thereof in plane 6. This intensity profile is shown in the lower part of FIG. 3a. The intensity is shown in arbitrary units. The effective width of the radiation beam, the slit width, is indicated as "sw". Such a rectangular intensity profile gives rise to homogeneity problems such as pulse quantization as already discussed above for FIGS. 1a,b.

FIG. 3b shows a known solution to decrease these problems, that however still has disadvantages. Again, a quartz rod 1, masking blades 2, a lens 3 and a patterning device 4 are shown, but note that the exit face of the rod 1 no longer lies in plane 5, which is still an image plane of the plane of surface 6 of the patterning device 4. In other words, the quartz rod 1 is defocused with respect to the rest of the optical system.

This defocusing causes an intensity profile like the one shown in the lower part of FIG. 3b, with a central plateau of highest intensity, and with two slopes with decreasing intensity. The effective slit width is again indicated, and in fact does not substantially change with respect to the effective slit width sw of FIG. 3a, by defocusing the rod 1. Although the problem of pulse quantization is mitigated by the presence of the slopes, as discussed above, in regard to FIG. 1, the problems of the increasing dimension of the radiation beam pop up. In particular, the total radiation beam width is larger than the effective width sw. This increased beam diameter must travel through the lens 3, which hence should have a larger diameter. This is difficult to achieve under the restriction of maintaining the specifications on optical quality and costs. Furthermore, the total scanning length increases by the difference between the total beam width and the effective beam width sw, which requires mechanical adaptation, and causes longer scanning times. Moreover, defocusing causes beam expansion not only in the y-direction as shown, but also in the perpendicular x-direction. This causes simply a loss of intensity, while beam expansion in any of the two directions requires blocking to prevent undesired illumination of parts of the substrate outside the target portion of the substrate. By the way, this blocking would be the cause of sharp borders to the radiation beam, which in turn would reintroduce the problem of pulse quantization.

FIG. 4 shows schematically a solution according to the present invention. Herein, a filter 7 is positioned near the exit face of the rod 1, and in the plane 5. Note that relative thicknesses are not to scale. The filter 7 has a transmission profile such that the resultant beam intensity profile is the one shown in the lower part of FIG. 4. It can be seen there that the total beam width is equal to the original effective beam width of FIG. 3a. Hence there are no problems due to a beam diameter that is too large for the lens 3, or that must be blocked additionally etc. However, due to the presence of the slopes $S_1'$ and $S_2'$, at the ends of the intensity profile, the advantages of a much reduced pulse quantization effect, and thus a much more homogeneous intensity distribution and received dose homogeneity is obtained. In fact, in this case the slopes each have a width equal to about 0.5 times sw. It is alternatively possible that the slopes have a smaller width, and that there is a plateau of substantially constant attenuation value between the slopes.

It is to be noted that every filtering will take away some of the intensity. However, this can easily be corrected by adjusting an overall second beam attenuator, such as a homogeneous grey-filter, or by adjusting the pulse energy of the source. Hence, advantageously, the lithographic apparatus comprises a second beam attenuator positioned in the radiation beam, and having an adjustable attenuation value for the radiation beam.

As stated above, it may be advantageous to provide the exit face or plane of the quartz rod etc. defocused, i.e. outside an image plane, since then a dust particle on the rod or a surface structure of the rod will not be imaged sharply, but is smeared out. Furthermore, the positive effect of defocusing on uniformity of received dose may still be worthwhile, even though there may be disadvantages connected thereto. Hence a combination of the filter, or more generally the beam attenuator, according to the invention and a defocused quartz rod may provide even better results in some cases. The beam attenuator may still be positioned near or at a conjugate plane of the patterning device.

The above discussion related to pulsed radiation sources and problems such as pulse quantization. It is to be noted, however, that similar advantages may be obtained when the radiation source emits continuously. This continuous emission may be regarded as a border case of an infinite number of infinitely short pulses, and which is approximated in the case of a pulsed radiation source by increasing the number of pulses required for a correct illumination.

Figure 5:
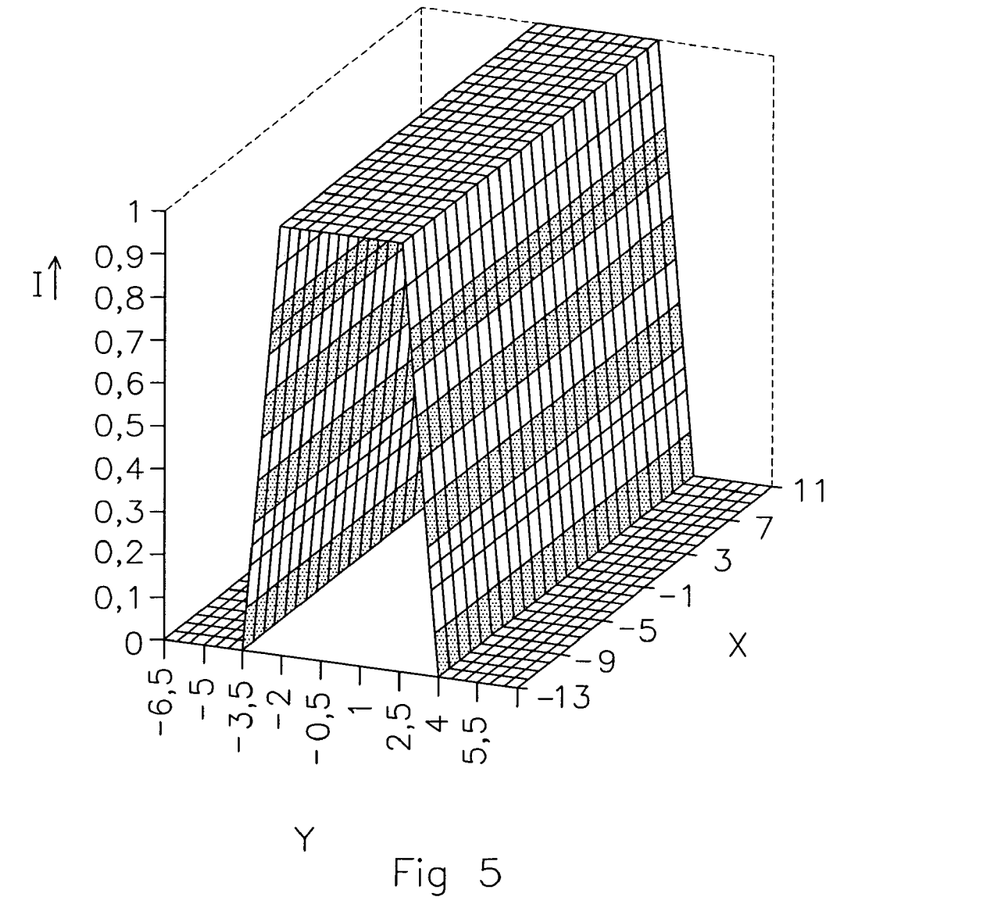
FIG. 5 shows an example of a beam intensity profile according to the invention.

FIG. 5 shows an example of a beam intensity profile according to the invention, in two dimensions. The intensity I is plotted in arbitrary, normalized units, while x and y are plotted in mm.

In this case, the scanning direction will be along the y-axis. As can be seen, the intensity is a constant as a function of x, i.e. does not change along the direction of the x-axis. A constant intensity in x-direction is advantageous, since there is no mechanism provided like scanning plus correction to control the dose as a function in x-direction. It is to be noted, however, that it is very well possible to combine the beam attenuator of the present invention with other functionalities, such as in a case where adjustment of the intensity profile in e.g. the x-direction (i.e. a direction perpendicular to the scanning direction) is desirable. For example, when for some reason the beam intensity shows a variation, such as a tilt, in x-direction, such that the beam intensity increases from negative x to positive x, or the like, it is possible to add a second filter to the beam attenuator of the invention, to correct this tilt in intensity. Alternatively, it is also possible to combine such an additional filter, or additional beam attenuator function, with the beam attenuator according to the invention. Such beam attenuator then no longer has an attenuation value profile that is a constant in a direction perpendicular to the intended scanning direction. Rather, said attenuation value profile is an additional function of position in a direction perpendicular to said scanning direction.

Figure 6:
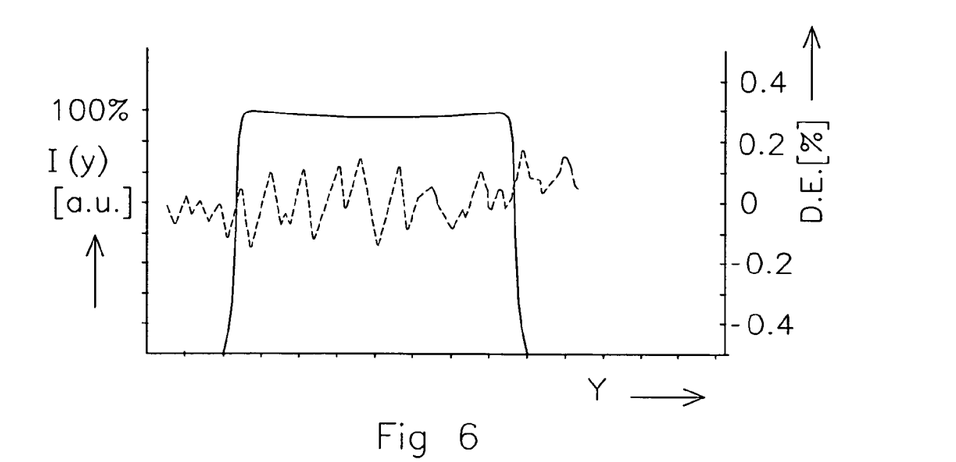
FIGS. 6 and 7 show two beam intensity profiles with their respective received dose error and pulse to pulse variations.
Figure 7:
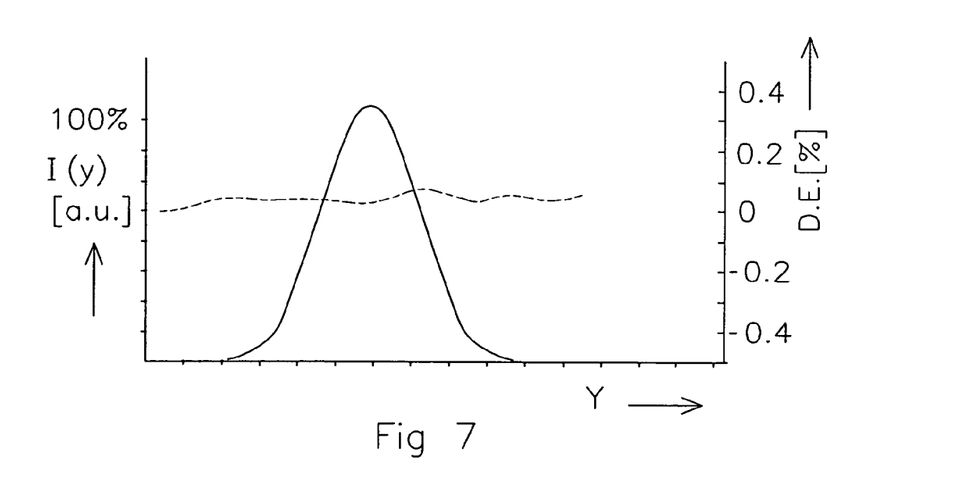

FIGS. 6 and 7 schematically show two beam intensity profiles I(y) (solid lines) with their respective received dose errors D.E. (dashed lines).

FIG. 6 shows a beam intensity profile that is substantially rectangular, with a central plateau and with slopes that are each much less than about 10% of the total width of the beam profile. The number of pulses in the effective beam width was 40. A predetermined pulse to pulse variation spectrum was used for this diagram of FIG. 6, as well as for FIG. 7. The result as can be derived from the diagram was that the dose error resulted in a scan uniformity of about 0.18%.

FIG. 7 shows a beam intensity profile according to the present invention. The number of pulses in the beam width is also 40.

It can be seen that the intensity profile of the beam with beam attenuator in FIG. 7 is much smoother than the one without beam attenuator in FIG. 6, and much smoother than could be achieved by simple defocusing without unduly broadening the beam. The effect of the much smoother curve and the much wider and gentler slopes of the profile are visible in the dose error, which now resulted in a scan uniformity of about 0.04%. Alternatively, a similar scan uniformity of about 0.17% could have been achieved in FIG. 7 with a much smaller number of pulses.

It is advantageous when the attenuation value profile has slopes, when looking along the scanning direction, such that the width of each of the slopes, when going from a lowest attenuation value at an edge to an attenuation value of half of said maximum attenuation value, is at least 5%, preferably 10%, more preferably at least 20% and most preferably about 50% of the effective width of the profile. In the latter case, this means that the central "maximum" or when appropriate "plateau" of the attenuation value, e.g. maximum filter transmission, is reduced to a line, or a line when looking along one line only. The total attenuation value profile becomes a smooth curve as the one shown in FIG. 7. Also compare FIG. 1b. In general words, a smooth attenuation value profile, with wide slopes is useful in some cases. On the other hand, narrow slopes, where possible, may offer the advantage of taking away less radiation.

Figure 8:
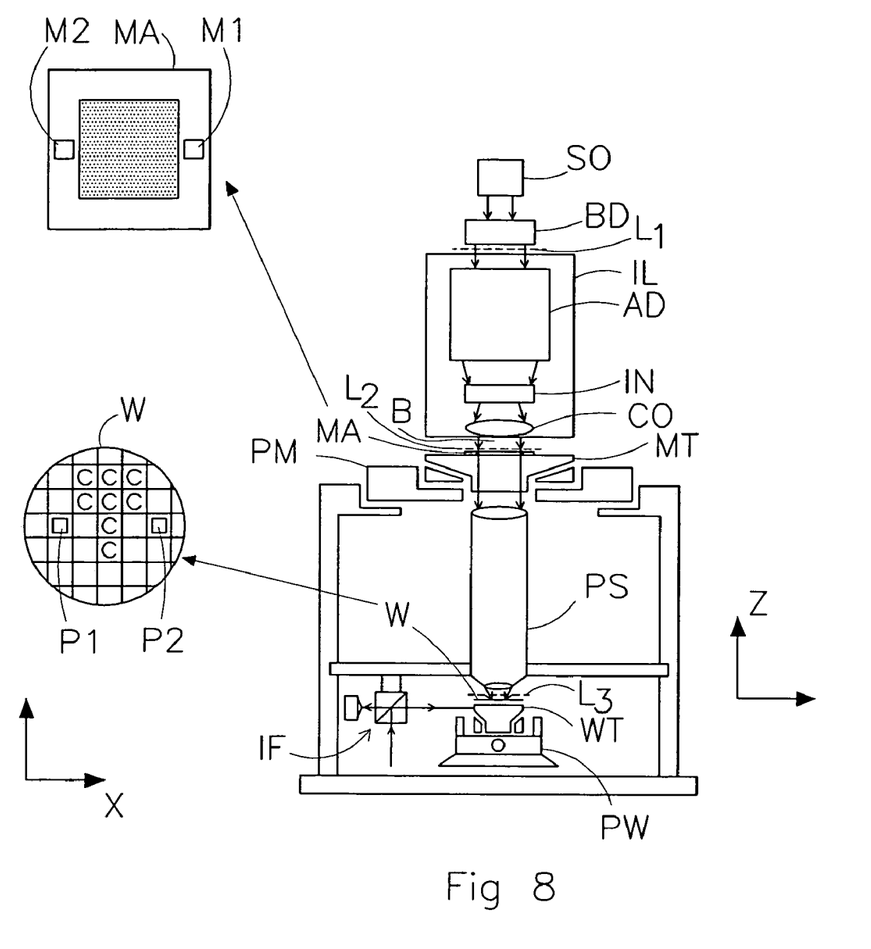
FIG. 8 depicts a lithographic apparatus according to an embodiment of the invention.

FIG. 8 schematically depicts a lithographic apparatus according to one embodiment of the invention. The apparatus comprises:
- a source SO and a beam delivery system, both of which are optional
- an illumination system (illuminator) IL configured to condition a radiation beam B (e.g. UV radiation or visible radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

Three possible positions for the beam attenuator as used in the invention have been indicated in FIG. 8 with dashed lines L1, L2 and L3, respectively.

Note that these planes are situated at or near image planes of the illumination system, i.e. where a sharp image is present. Put another way, these planes L1, L2 and L3 relate to the plane of (or very near) the patterning device and the conjugate planes thereof.

In particular, plane L1 relates to an exit plane of e.g. a quartz rod (see also FIG. 3), or any corresponding plane of the illuminator IL. For example, the beam attenuator may be present directly at such an exit plane of the quartz rod.

L2 relates to a plane of the patterning device. A good control over the illumination of the patterning device is thus obtained. Furthermore, the beam attenuator may be combined with other parts already present at or near that position, such as a grey-filter or uniformity correction module (for correcting beam uniformity in a non-scanning direction, for example).

The plane L3 relates to the plane of the wafer or other substrate. Although this is a possible position, the smaller size of the beam at this position makes this embodiment slightly more complicated than when positioned at L1 or L2.

It is possible for the beam attenuator to be fixedly positioned in a position in the radiation beam as described above. This allows a reliable positioning. More generally, however, it is possible for the beam attenuator to be mounted such that it is moveable into a position in the radiation beam. This offers more flexibility to the lithographic apparatus, in that when attenuation is desired, the beam attenuator is positioned in the radiation beam, at a desired position such as in a position adjacent the patterning device and/or adjacent the substrate. This situation may e.g. relate to the production of ICs. Subsequently, when attenuation is no longer desired, such as for maximum beam intensity, the beam attenuator may be positioned out of the radiation beam. To this end, the beam attenuator may for example be positionable at a position where also other types of beam attenuators are positionable, such as beam attenuators for correction beam homogeneity in a direction perpendicular to the scanning direction. Furthermore, it is also possible to combine the beam attenuator according to the invention with other optical elements such as a diffuser, for further improvement of the homogeneity.

Moreover, the beam attenuator may be mounted exchangeably. An exchangeable beam attenuator offers more design flexibility as the attenuation value profile may be adjusted as desired by exchanging a first beam attenuator for a second, different beam attenuator.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Hence, in the depicted and advantageous embodiment, the beam attenuator is a transmissive filter with a desired attenuation value profile, i.e. transmission profile. The filter may be positioned on any of the indicated planes, or any other conjugate plane thereof.

Alternatively, the apparatus may be of a reflective type (e.g. employing a programmable mirror array of a type as referred to above, or employing a reflective mask). In that case, the beam attenuator may also be of the reflective type, for example a mirror with the desired attenuation value profile, i.e. reflectivity profile or corresponding absorptivity profile. The reflecting surface of such a mirror may be positioned in a conjugate plane of the patterning device.

Note that the beam attenuator may be of the reflective type even in the case of an apparatus of the (otherwise) transmissive type. Vice versa, in an apparatus of the reflective type, the beam attenuator may very well be of the transmissive type, i.e. a filter, as long as the filter itself allows sufficient transmission of the radiation used.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 8, the illuminator IL receives a radiation beam from a radiation beam source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the lithographic apparatus comprises a radiation beam source, for example when the source is a mercury lamp. Then the optical properties, such as positioning may be adapted optimally to the rest of the lithographic apparatus. The source SO and the illuminator IL, together with the beam delivery system BD if required, may be referred to as a radiation system.

The source SO or radiation system as a whole may provide a continuous beam of radiation. That is to say, during illumination of the substrate the illumination is continuous, while between illuminating a part of the substrate and another part of the substrate the beam of radiation may of course be blocked. The beam attenuator according to the invention will provide for improved dose control, as follows. Illumination of the substrate begins with a low intensity, due to the high attenuation value. Subsequently, when the beam scans the surface of the patterning device, and the substrate is moved with respect to the beam accordingly, the beam passes through (or is reflected from, etc.) a part of the beam attenuator that shows a lower attenuation value, and thus the patterned beam that will strike the substrate will then have a higher intensity.

In particular, the radiation beam source SO may comprise a pulsed radiation beam source and/or a radiation beam source constructed to provide a radiation beam with a dipole intensity. A pulsed illumination is more sensitive to an irregular illumination, due to e.g. pulse quantization. Furthermore, illumination with a radiation beam with a dipole intensity is very sensitive to pulse to pulse variations, due to a sharp and distinct shadow in one direction and a vague, soft shadow with wide slopes in a second, perpendicular direction. Hence, in these cases, the lithographic apparatus with the beam attenuator according to the invention can offer improved homogeneity of illumination.

In the case of pulsed illumination, the total dose is to be built up of a predetermined number of pulses, and the present invention will show a remarkable improvement over known apparatus.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

2. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 9A:
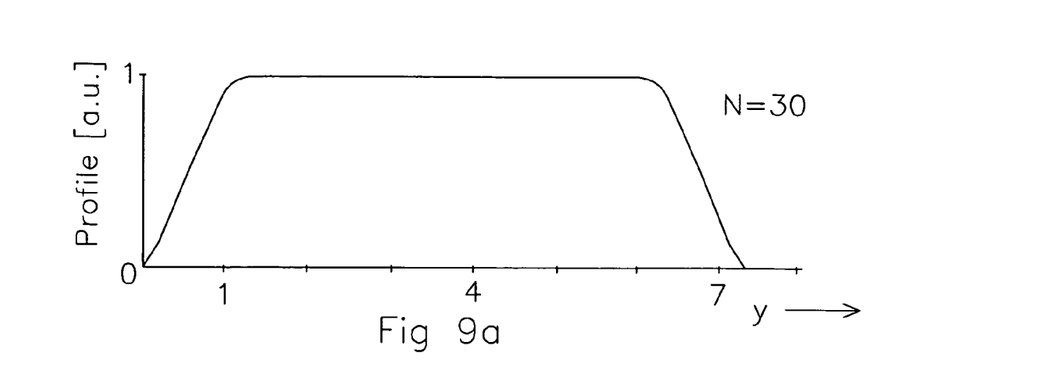
FIGS. 9a, b and 10a, b schematically depict a first and a second attenuation value profile of a first and second beam attenuator, respectively, and the frequency response of a laser system with and without such beam attenuator.

FIGS. 9a, b and 10a, b schematically depict the frequency response of a laser system with and without beam attenuator, for a first profile and a second profile, respectively.

FIG. 9a shows a first beam intensity profile, corresponding to an attenuation value profile, as a function of position in the beam. The intensity, or attenuation, is normalized, and is based on 30 pulses in a slit. The slopes are substantially straight lines, and there is a substantially flat plateau in the middle.

Figure 9B:
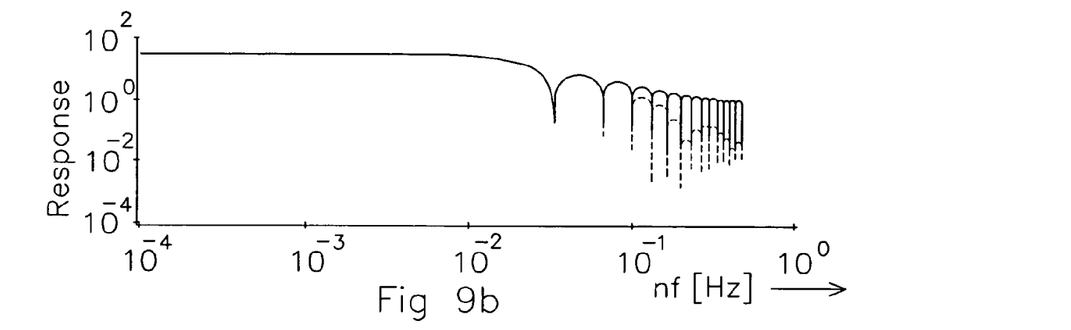

FIG. 9b schematically shows a normalized frequency response of an exemplary laser system, in the solid line. The dashed line shows the response when the beam attenuator of FIG. 9a is added in the radiation beam.

The basic frequency response relates to variations in laser pulse energy that vary from pulse to pulse. In the response, clear and sharp dips are visible that relate to certain characteristics of a laser system used. For example, this may relate to resonances in the laser medium system, such as a gas pump. In other words, variations in laser pulse energy may show certain dips at e.g. every 200 pulses, or any other number relating to that specific laser system, which variations are larger than normal random variations.

The lower, dashed line of FIG. 9b indicates the frequency response of the system inclusive a beam attenuator having an attenuation value profile shown in FIG. 9a. As can be seen, the frequency response is much lower for certain frequency ranges. In particular, in those ranges, the peaks are much suppressed. In other words, the laser system specific pulse to pulse variations may be suppressed by selecting a beam attenuator with an attenuation value profile that causes attenuation at those frequencies.

However, this attenuation behaviour is still far from ideal. For example, the suppression is not very large, and furthermore the suppression itself, i.e. the ratio of the two curves, show undesired minima and maxima. For example, around a normalized frequency of 0.2 Hz the suppression is rather high, while at around 0.1 Hz but also around 0.3 Hz the suppression is much lower.

Figure 10A:
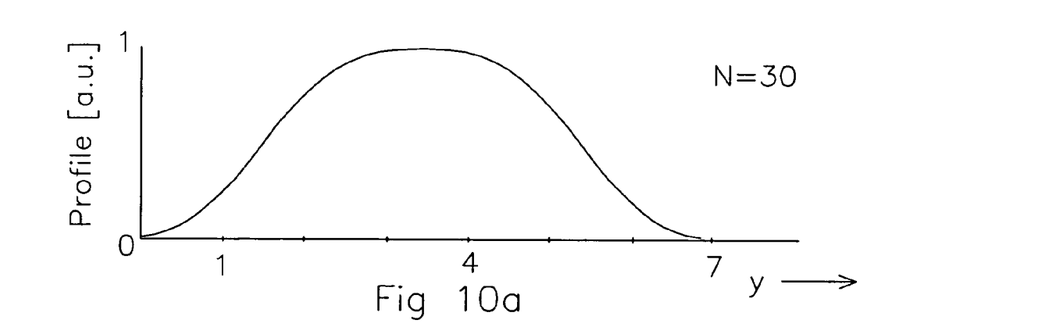

FIG. 10a shows another attenuation value profile of a beam attenuator according to the invention. The profile more or less has a bell shape with slopes that are much wider than in FIG. 9a.

Figure 10B:
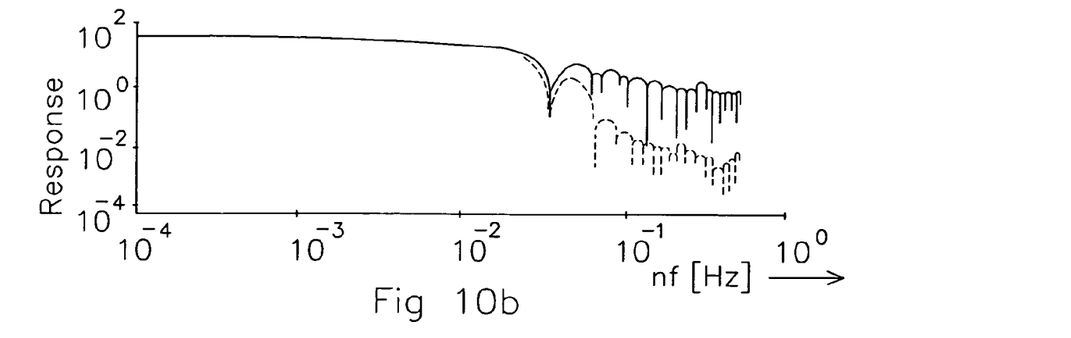

FIG. 10b shows a normalized frequency response of the same laser system, again with 30 pulses in the slit (solid line). The effect of the different profile, as compared to the solid line of FIG. 9b, is that the curve as a whole is shifted upwards as well as to the left with respect to the frequency scale. The dashed line shows the normalized frequency response of the laser system with beam attenuator in the radiation beam. As can be clearly seen in the Figure, the attenuation and suppression of the dips is much better for a much wider frequency range. In other words, using a beam attenuator of FIG. 10a allows the suppression of much more pulse to pulse variations of a laser system. Furthermore, the suppression shows a much more regular progress. In other words, the ratio of response with and without beam attenuator is much more constant. This allows more freedom in shifting the response curve by selecting a different number of pulses in the slit.

FIGS. 9a, b and 10a, b show that the shape of the beam attenuation value curve influences the pulse-to-pulse variation suppression significantly. Hence, by suitably selecting the shape of said profile, pulse-to-pulse variations of the laser system used may effectively be suppressed. The specific shape actually used will of course depend on the characteristics of the laser system used. Note, however, that the beam attenuator according to the present invention allows a much better suppression of such variations. This in itself increases the illumination homogeneity.

One benefit of the present invention, among many, is that it provides a relatively low variation in beam intensity and does so without significantly increasing the radiation beam diameter, if at all.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate and moveable in a scanning direction with respect to the support;
    a projection system configured to project the patterned radiation beam onto a target portion of the substrate; and
    a beam attenuator constructed to reduce an intensity of a part of the radiation beam, and having an attenuation value profile that varies as a function of position along said scanning direction so as to vary the intensity of the part of the radiation beam as a function of position along said scanning direction.

2. A lithographic apparatus according to claim 1, wherein said attenuation value profile is a substantially non-rectangular function of position.

3. A lithographic apparatus according to claim 1, wherein said beam attenuator comprises an attenuator portion that is arranged to be illuminated by the radiation beam, wherein said attenuator portion has opposed first and second edges in said scanning direction, and wherein said attenuation value profile has a first attenuation value at said first edge and a second attenuation value at said second edge.

4. A lithographic apparatus according to claim 3, wherein said first value and said second value each are smaller than an average attenuation value as averaged over said attenuator portion and along said scanning direction.

5. A lithographic apparatus according to claim 1, wherein said attenuation value profile has an axis of substantial symmetry in a direction perpendicular to the scanning direction.

6. A lithographic apparatus according to claim 3, wherein said first attenuation value, or said second attenuation value, or both, is substantially zero.

7. A lithographic apparatus according to claim 3, wherein said attenuation value profile has a maximum attenuation value, greater than said first and second attenuation values, in a maximum position distanced from both said first edge and second edge of said attenuator portion.

8. A lithographic apparatus according to claim 7, wherein a first distance between said first edge and said maximum position and a second distance between said second edge and said maximum position are each at least 5% of a third distance measured between said first edge and said second edge.

9. A lithographic apparatus according to claim 8, wherein said first and second distances are each at least 10% of said third distance.

10. A lithographic apparatus according to claim 8, wherein said first distance, or said second distance, or both, is substantially 50% of said third distance.

11. A lithographic apparatus according to claim 1, wherein said attenuation value profile substantially has a shape selected from the group comprising: a trapezoid, a substantially Gaussian shape, a bell-shape, and an error-function shape.

12. A lithographic apparatus according to claim 1, wherein said attenuation value profile is an additional function of position in a direction perpendicular to said scanning direction.

13. A lithographic apparatus according to claim 1, wherein the beam attenuator is mounted in said lithographic apparatus so as to be moveable into an active position in the radiation beam and an inactive position remote from said radiation beam.

14. A lithographic apparatus according to claim 1, wherein the beam attenuator is exchangeably mounted.

15. A lithographic apparatus according to claim 1, wherein said beam attenuator is fixedly mounted in said lithographic apparatus in a position in a path of said radiation beam.

16. A lithographic apparatus according to claim 1, wherein said beam attenuator is a transmissive filter having a transmission value profile.

17. A lithographic apparatus according to claim 16, wherein said filter is positionable in a position adjacent the patterning device or adjacent the substrate.

18. A lithographic apparatus according to claim 1, wherein said illumination system comprises a transparent rod through which the radiation beam passes in use, wherein the filter is positionable in a position adjacent an exit plane of the transparent rod.

19. A lithographic apparatus according to claim 18, wherein said filter is positionable in or adjacent a plane that is a conjugate plane of a plane of the patterning device.

20. A lithographic apparatus according to claim 18, wherein said rod is a defocused rod, with a conjugate plane of an exit plane of said rod differing from a plane wherein said patterning device lies in use.

21. A lithographic apparatus according to claim 1, further comprising a radiation beam source configured to provide said radiation beam.

22. A lithographic apparatus according to claim 21, wherein said radiation beam source comprises a pulsed radiation beam source and/or a radiation beam source constructed to provide a radiation beam with a dipole intensity distribution.

23. A lithographic apparatus according to claim 1, comprising a second beam attenuator positioned in a path of the radiation beam, and having an adjustable attenuation value for the radiation beam.

24. A device manufacturing method, comprising:

imparting a radiation beam with a pattern in its cross-section using a patterning device to form a patterned radiation beam and projecting the patterned beam of radiation onto a substrate by way of a lithographic apparatus comprising a substrate table constructed to hold the substrate and moveable in a scanning direction with respect to a support configured to hold the patterning device and a beam attenuator constructed to reduce an intensity of a part of the radiation beam and having an attenuation value profile that varies as a function of position along the scanning direction so as to vary the intensity of the part of the radiation beam as a function of position along said scanning direction, wherein said beam attenuator is positioned in said radiation beam.

25. A device manufacturing method according to claim 24, wherein said attenuation value profile is a substantially non-rectangular function of position.

26. A method comprising:

projecting a patterned beam of radiation onto a substrate;

moving the substrate in a scanning direction during the projecting; and reducing an intensity of a part of the radiation beam with a beam attenuator having an attenuation value profile that varies as a function of position along the scanning direction so as to vary the intensity of the part of the radiation beam as a function of position along said scanning direction.

* * * * *